United States Patent [19]

Beguwala et al.

[11] 4,277,320
[45] Jul. 7, 1981

[54] PROCESS FOR DIRECT THERMAL NITRIDATION OF SILICON SEMICONDUCTOR DEVICES

[75] Inventors: Moiz M. E. Beguwala, Placentia; Francis M. Erdmann, Anaheim, both of Calif.

[73] Assignee: Rockwell International Corporation, El Segundo, Calif.

[21] Appl. No.: 80,859

[22] Filed: Oct. 1, 1979

[51] Int. Cl.³ .................... C01B 21/068; B05D 3/06; H01L 7/00
[52] U.S. Cl. .................... 204/164; 148/1.5; 204/177; 423/344; 427/53.1; 427/94
[58] Field of Search .................. 204/164, 177; 427/94, 427/53.1; 423/344

[56] References Cited

U.S. PATENT DOCUMENTS

| 3,419,761 | 12/1968 | Pennebaker | 357/52 |
| 3,924,024 | 12/1975 | Naber et al. | 427/95 |
| 4,056,642 | 11/1977 | Saxena et al. | 427/84 |
| 4,181,751 | 1/1980 | Hall et al. | 427/53.1 |
| 4,206,190 | 6/1980 | Harvey et al. | 423/344 |

FOREIGN PATENT DOCUMENTS 60197 3/1967 German Democratic Rep. .

OTHER PUBLICATIONS

Schnabel et al., Chem. Abs. vol. 70, Abstract 32743f (1969).
IBM Disclosure Bulletin by Hu et al., vol. 10, No. 2, Jul. 1967.
Kaiser et al., Chem. Abs., vol., Abstract 15685g (1959).

*Primary Examiner*—F. C. Edmundson
*Attorney, Agent, or Firm*—H. Fredrick Hamann; Daniel R. McGlynn

[57] ABSTRACT

A process for the direct thermal nitridation of silicon semiconductor devices in which the semiconductor body is placed in an atmosphere of $N_2$, at a temperature of less than 1000° C. The $N_2$ is activated by an RF electrical field which ionizes the nitrogen, which then combines with the silicon surface.

8 Claims, 1 Drawing Figure

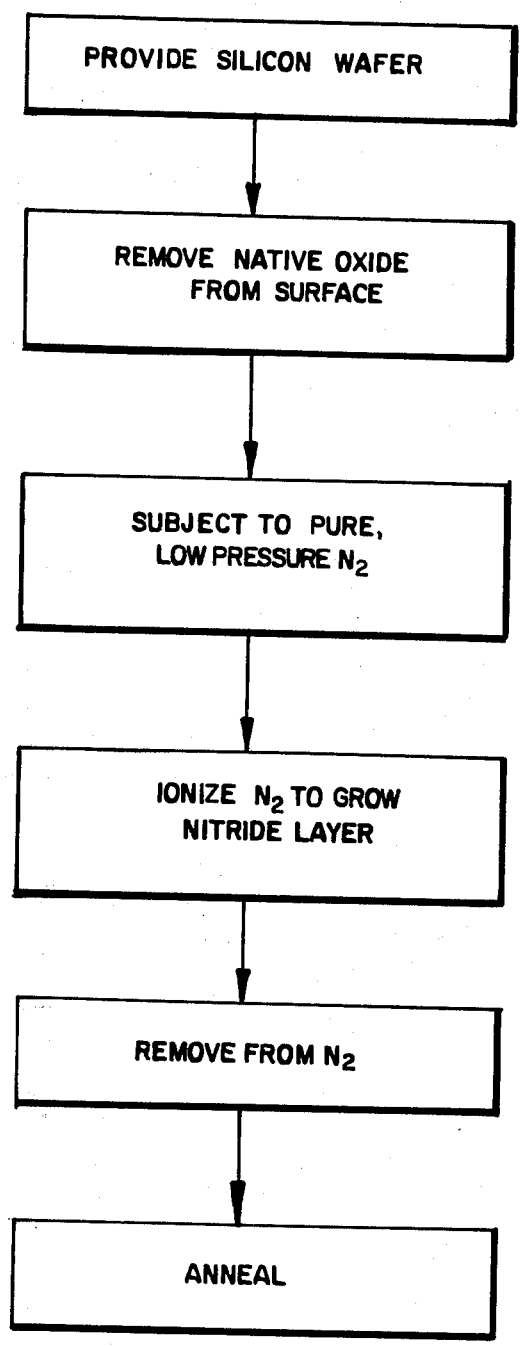

PROCESS FOR DIRECT THERMAL NITRIDATION OF SILICON SEMICONDUCTOR DEVICES

The invention herein described was made in the course of or under a contract or subcontract thereof, with the United States Air Force.

BACKGROUND OF THE INVENTION

1. Field of the Invention

The invention relates to processes for fabrication of semiconductor devices, and in particular to the fabrication of metal-nitride-silicon (MNS) devices.

2. Description of the Prior Art

Metal-nitride-oxide-semiconductor (MNOS) structures are well known in the prior art, such as in U.S. Pat. No. 3,419,761, particularly for the fabrication of insulated gate field effect transistors. Silicon nitride ($Si_3N_4$, hereafter referred to simply as "nitride") as a gate dielectric for an MIS device has a number of desirable properties, including a high dielectric constant ($6.2\epsilon_o$) and a high dielectric breakdown strength as compared to silicon dioxide ($SiO_2$, hereafter referred to simply as "oxide"). During early days of MIS device processing, it was recognized that the presence of nitride over oxide as a dual dielectric structure minimized ionic contamination of the oxide layer. The dual dielectric structure, however, did exhibit bias-temperature (B-T) instability.

Other techniques in which the nitride layer is deposited directly over silicon by a chemical vapor deposition (CVD) or reactive silane-ammonia plasma technique results in a porous structure with a large hysteresis in the capacitance-voltage characteristics of the resultant MIS structure, not suitable for the gate electrode in high performance FET devices. It has been reported recently (reference 1) that one can convert the surface of silicon into a nitride if the silicon wafer is heated in nitrogen or $NH_3$ to 1200°-1300° C. The growth rate of the nitride has been reported (reference 2) to vary as a function of time and a maximum growth rate of 2.8 Å/sec has been achieved in $N_2$ at 1250° C. after a 120 seconds exposure. The nitride film obtained by this technique exhibits an index of refraction of $\approx 2$-2.3. The direct thermally grown nitride films of $\approx 75$-100 Å film thickness have also been shown to act as very efficient oxidation and diffusion masks. In addition the nitride film can be used as a gate dielectric layer where the density of surface state at the nitride-silicon surface is low ($\approx 3 \times 10^{10}$ $cm^{-2}$ $ev^{-1}$) and the channel electron mobility is high ($\approx 800$ $cm^2$/v-sec).

Direct thermally grown nitride has been used in the prior art to fabricate IGFET type devices such as described in reference 1. A 95 Å nitride layer, grown in $NH_3$ at 1000° C., was used as a gate dielectric. The electrical properties of the nitride layer, however, have been shown to be sensitive to the level of $O_2$ contamination in the p.p.m. range. The purity of $NH_3$, in particular the $H_2O$ contamination, is believed to exhibit considerable variation depending upon the source and the ambient conditions which makes such processes disadvantageous.

Attempts have also been made in the prior art to nitridate silicon wafers in $N_2$, such as described in reference 2. This, however, requires one to raise the silicone substrate temperature to greater than 1300° C. In many instances such a high temperature process step is not compatible with the substrate, such as silicon on sapphire (SOS), due to the introduction of impurities into the active silicon layer from the underlying substrate. In some cases this high temperature step might cause formation of additional lattice defects in the silicon.

The high nitridation temperature limits the use of the above process in VLSI and VHSI circuit processing due to the following effects:

(a) thermal distortion of the silicon substrate which would require large alignment tolerance and hence less circuit packing density.

(b) excessive thermal outdiffusion of elements from the sapphire substrate into the silicon in case a silicon-on-sapphire substrate is used.

(c) increased redistribution of dopants in the silicon substrate.

Prior to the present invention there has not been a process of direct thermal nitridation of silicon suitable for fabrication of semiconductor devices.

PRIOR ART STATEMENT

The most pertinent prior art known to the applicant is as follows:

1. T. Ito, T. Nozski, H. Arakawa and M. Shinoda, "Thermally Grown Silicon Nitride Films for High-Performance MNS Devices," Appl. Phys. Lett., 32, 330, 1978
2. T. Ito, S. Hijiya, T. Nozaki, H. Arakawa, M. Shinoda and Y. Fukukawa, "Very Thin Silicon Nitride Films Grown by Direct Thermal Reaction with Nitrogen", Jour. of Electrochem. Soc., 125, No. 3, 448 (1978)
3. T. Ito, S. Hijiya, H. Ishikawa and M. Shinoda, "10V Write/Erase, EAROM Cells with Directly Nitrided Silicon Nitride Films As First Insulating Layers", IEEE IEDM Technical Digest, p. 284, Washington, D.C., December 1977
4. M. J. Rank, Ext. Abst #193 ECS Fall Mtg., Atlanta 1977

SUMMARY OF THE INVENTION

Briefly, and in general terms, the invention is concerned with a method for the formation of a gate dielectric layer for an insulated gate field effect transistor (IGFET), and in particular with a method for the direct nitridation of silicon at relatively low temperatures.

The invention provides the steps of subjecting a silicon semiconductor body to an atmosphere of $N_2$, ionizing the atmosphere of $N_2$ for a predetermined time, and removing the body from the $N_2$ atmosphere. Alternatively, the silicon semiconductor body may be directly subjected to an atmosphere of ionized $N_2$, and then removed.

The nitridation of silicon on the surface of the semiconductor body is preferably performed by activating the $N_2$ by an external RF field, which can be carried out at tempertures less than 1000° C.

The novel features which are considered as characteristic for the invention are set forth in particular in the appended claims. The invention itself, however, both as to its construction and its method of operation, together with additional objects and advantages thereof will be best understood from the following description of specific embodiments when read in connection with the accompanying drawing.

BRIEF DESCRIPTION OF THE DRAWING

The single FIGURE is a list of process steps for direct nitridation of silicon at relatively low temperatures according to the present invention.

DESCRIPTION OF THE PREFERRED EMBODIMENT

The present invention is concerned with a process for the direct nitridation of silicon, and the application of such process to the formation of a gate dielectric layer in an IGFET.

Turning now to the single FIGURE, there is shown a sequence of steps for the direct nitridation of silicon according to the present invention. One starts with a bare silicon wafer and removes the native oxide from the surface. This may be done preferably by placing the wafer in a chamber with an ultrapure hydrogen atmosphere, or a dilute HF atmosphere.

The native-oxide-removing atmosphere is then removed from the chamber, and low pressure, substantially pure $N_2$ introduced. Alternatively, substantially pure $NH_3$ or other gas containing nitrogen may be used.

The present invention provides that the nitridation of silicon be performed in the $N_2$ at temperatures less than 1000° C. by electrically activating the $N_2$. An external RF electrical field is introduced to ionize the nitrogen, so that an $N_2$ plasma is produced, and the free nitrogen radicals then readily combine with the silicon surface.

The $N_2$ ionization is performed for a predetermined period of time depending upon the desired thickness of the nitride layer.

The body is then removed from the nitrogen atmosphere, and annealed at a temperature of from 800°–1000° C. in an inert gas.

The application of such process to the formation of a gate electrode for an IGFET, such as masking procedures, formation of contacts, and the like, would be within the knowledge of a person skilled in the semiconductor processing art and need not be described here.

The results of the process according to the present invention in one experiment can now be described.

The samples of silicon wafers were heated by coupling energy from an RF field into a silicon carbide susceptor. The sample temperature was determined to be approximately 975° C. by an optical pyrometer. $N_2$ gas was introduced by means of a leak valve into the evacuated chamber. Special care was taken to purify the $N_2$ and reduce the level of $O_2$ contamination before it was introduced in the sample chamber. The $N_2$ in the sample chamber was then covered to a N+ plasma by the same RF field used to heat the sample. Nitride films were deposited in varying thicknesses. The thickest film obtained was approximately 200 Å. The film thickness and index of refraction were determined by ellipsometer measurements. The index of refraction was determined to be −1.85. Various capacitance-voltage curves were obtained on such capacitors. A qualitative comparison of the C-V curve with that obtained on oxide capacitors indicates a low $N_{SS}$. The breakdown voltage of the capacitors was found to be in excess of ±15 volts.

The C-V curve, however, did exhibit a small hysteresis. This could arise due to several reasons. The presence of a nascent oxide on the sample surface can cause an interface between the silicon and the nitride. The oxide-nitride interface can store charge in deep traps that have a long trapping time. Thus the charge stored in these traps can alter the flatband voltage and give rise to the hysteresis effect similar to a nonvolatile MNOS memory device. The presence of trace amounts of oxygen in the nitrogen can also lead to the formation of the oxide. It is hypothesized that the oxygen-silicon interface diffuses into the silicon substrate faster than the silicon-nitrogen interface, thus resulting in the MNOS-like structure. However, the presence of a thick oxide might form a passivation barrier and prevent the formation of the nitride.

While the invention has been illustrated and described as embodied in a process for direct thermal nitridation of silicon semiconductor devices, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitutes essential characteristics of the generic or specific aspects of this invention, and, therefore, such adaptations should and are intended to be comprehended within the meaning and range of equivalence of the following claims.

What is claimed is:

1. A method of forming a high purity silicon nitride layer on a major surface of a silicon semiconductor body comprising the steps of:
    removing the native oxide from the surface of the silicon semiconductor body by subjecting the body to a hydrogen atmosphere;
    subjecting said silicon semiconductor body to an atmosphere entirely comprising substantially pure $N_2$;
    ionizing said atmosphere for a predetermined period of time so that the nitrogen is ionized;
    chemically reacting the nitrogen ions with silicon on the surface of said silicon semiconductor body so that the nitrogen ions and the silicon combine to form a layer of silicon nitride on the body; and
    removing said silicon semiconductor body from said nitrogen atmosphere.

2. A method as defined in claim 1, wherein said step of ionizing said atmosphere is done at a temperature of less than 1200° C.

3. A method as defined in claim 1, further comprising the step of subsequently annealing said body in an inert gas atmosphere at a temperature from 800°–1000° C.

4. A method as defined in claim 2, wherein said step of ionizing said atmosphere is done at a temperature of less than 1000° C.

5. A method of forming a high purity silicon nitride layer on a major surface of a silicon semiconductor body comprising the steps of:
    removing the native oxide from the surface of the silicon semiconductor body by subjecting the body to a hydrogen atmosphere;
    subjecting said silicon semiconductor body to an atmosphere entirely comprising substantially pure $NH_3$;
    ionizing said atmosphere for a predetermined period of time so that the nitrogen is ionized;
    chemically reacting the nitrogen ions with silicon on the surface of said silicon semiconductor body so that the nitrogen ions and the silicon combine to form a layer of silicon nitride on the body; and
    removing said silicon semiconductor body from said nitrogen atmosphere.

6. A method as defined in claim 5, wherein said step of ionizing said atmosphere is done at a temperature of less than 1200° C.

7. A method as defined in claim 5, further comprising the step of subsequently annealing said body in an inert gas atmosphere at a temperature from 800°–1000° C.

8. A method as defined in claim 5, wherein said step of ionizing said atmosphere is done at a temperature of less than 1000° C.

* * * * *

UNITED STATES PATENT AND TRADEMARK OFFICE
CERTIFICATE OF CORRECTION

PATENT NO. : 4,277,320

DATED : July 7, 1981

INVENTOR(S) : Beguwala et al

It is certified that error appears in the above–identified patent and that said Letters Patent are hereby corrected as shown below:

In column 3, line 45, please delete [covered] and insert --converted--.

Signed and Sealed this

Twenty-fourth Day of November 1981

[SEAL]

Attest:

GERALD J. MOSSINGHOFF

Attesting Officer

Commissioner of Patents and Trademarks